(12) United States Patent
Chen et al.

(10) Patent No.: US 11,699,840 B2
(45) Date of Patent: Jul. 11, 2023

(54) ANTENNA PACKAGE STRUCTURE AND ANTENNA PACKAGING METHOD

(71) Applicant: SJ Semiconductor (Jiangyin) Corporation, Jiangyin (CN)

(72) Inventors: Yenheng Chen, Jiangyin (CN); Chengchung Lin, Jiangyin (CN); Chengtar Wu, Jiangyin (CN); Jangshen Lin, Jiangyin (CN)

(73) Assignee: SJ SEMICONDUCTOR (JIANGYIN) CORPORATION, Jiangyin (CN)

( * ) Notice: Subject to any disclaimer, the term of this patent is extended or adjusted under 35 U.S.C. 154(b) by 21 days.

(21) Appl. No.: 17/545,650

(22) Filed: Dec. 8, 2021

(65) Prior Publication Data

US 2022/0102837 A1     Mar. 31, 2022

Related U.S. Application Data

(62) Division of application No. 16/354,464, filed on Mar. 15, 2019, now Pat. No. 11,228,087.

(30) Foreign Application Priority Data

Mar. 16, 2018   (CN) .......................... 201810217683.4
Mar. 16, 2018   (CN) .......................... 201820359524.3

(51) Int. Cl.
*H01Q 1/22*      (2006.01)
*H01Q 21/00*     (2006.01)
*H01Q 9/04*      (2006.01)
*H01Q 21/06*     (2006.01)
*H01L 23/00*     (2006.01)
*H01L 23/66*     (2006.01)

(52) U.S. Cl.
CPC .......... *H01Q 1/2283* (2013.01); *H01L 23/66* (2013.01); *H01L 24/17* (2013.01); *H01L 24/95* (2013.01); *H01Q 9/0421* (2013.01); *H01Q 21/0087* (2013.01); *H01Q 21/065* (2013.01); *H01L 2223/6677* (2013.01); *H01L 2924/014* (2013.01)

(58) Field of Classification Search
CPC ............... H01Q 1/2283; H01Q 9/0421; H01Q 21/0087; H01Q 21/065; H01L 23/66; H01L 24/17; H01L 24/95; H01L 2924/014; H01L 2223/6677
USPC ......................................................... 257/737
See application file for complete search history.

(56) References Cited

U.S. PATENT DOCUMENTS

| | | | |
|---|---|---|---|
| 2019/0181104 A1* | 6/2019 | Chen | H01Q 21/065 |
| 2019/0288372 A1* | 9/2019 | Chen | H01L 23/66 |
| 2019/0288374 A1* | 9/2019 | Lin | H01Q 1/2283 |
| 2019/0348380 A1* | 11/2019 | Chen | H01Q 1/2283 |
| 2020/0058605 A1* | 2/2020 | Chen | H01L 23/49811 |

* cited by examiner

*Primary Examiner* — Jami Valentine Miller
(74) *Attorney, Agent, or Firm* — Alston & Bird LLP

(57) ABSTRACT

The present disclosure provides an antenna package structure and an antenna packaging method. The package structure includes an antenna circuit chip, a first packaging layer, a first rewiring layer, an antenna structure, a second metal connecting column, a third packaging layer, a second antenna metal layer, and a second metal bump. The antenna circuit chip, the antenna structure, and the second antenna metal layer are interconnected by using the rewiring layer and the metal connecting column.

10 Claims, 7 Drawing Sheets

ANTENNA PACKAGE STRUCTURE AND ANTENNA PACKAGING METHOD

CROSS REFERENCES TO RELATED APPLICATIONS

This application is the divisional application of U.S. patent application Ser. No. 16/354,464, filed Mar. 15, 2019, entitled "ANTENNA PACKAGE STRUCTURE AND ANTENNA PACKAGING METHOD". This application claims the benefits of priority to U.S. patent application Ser. No. 16/354,464, Chinese Patent Application No. CN2018102176834, entitled "ANTENNA PACKAGE STRUCTURE AND ANTENNA PACKAGING METHOD", filed with CNIPA on Mar. 16, 2018, and Chinese Patent Application No. CN2018203595243, entitled "ANTENNA PACKAGE STRUCTURE", filed with CNIPA on Mar. 16, 2018, the contents of which are incorporated herein by reference in its entirety.

TECHNICAL FIELD

The present disclosure relates to the field of semiconductor packaging, and in particular, to an antenna package structure and an antenna packaging method.

BACKGROUND

Various high-tech electronic products have been developed to bring convenience to users, including devices such as laptops, mobile phones, and portable Android devices (PAD), etc.

Increased demands for these popular high-tech electronic products have enabled more functions and applications configured into these high-tech products. In addition, to meet the need for mobilization, the function of wireless communication is provided. Thus, users can access the high-tech electronic devices with the function of wireless communication anywhere or any time. This greatly increases the flexibility and convenience in use of these products. Therefore, users no longer have to be confined to a certain area, and can enjoy the convenience brought by these electronic products.

In general, existing antenna structures in IC devices usually have many types, for examples, they are dipole antenna, monopole antenna, patch antenna, planar inverted-F antenna, meander line antenna, inverted-L antenna, loop antenna, spiral antenna and spring antenna. A known practice is to manufacture an antenna directly on the surface of a circuit board. By this practice, an antenna occupies an extra space of the circuit board, thereby resulting in a low integration level to the chip. For various electronic devices, a large circuit board means a large size. However, the main purpose of designing and developing these electronic devices is to allow users to carry them easily. Therefore, how to reduce the area of the circuit board occupied by an antenna, and improve the integration performance of an antenna packaging structure is the key to solve the problems of these electronic devices.

In addition, an existing antenna package is typically of a single-layer structure with low antenna efficiency, which cannot meet the increasing demand for antenna performance.

Based on the above, it is necessary to provide a packaging structure and packaging method for an antenna with a high degree of integration and high efficiency.

SUMMARY

The present disclosure provides an antenna package structure, including: an antenna circuit chip; a first packaging layer, disposed on the antenna chip, wherein the first packaging layer comprises a first surface and a second surface opposite to the first surface, wherein two ports on a front surface of the antenna chip are exposed from the first surface; a first rewiring layer, formed on the first surface of the first packaging layer, wherein the first rewiring layer comprises a first surface connected to the two ports of the antenna chip, wherein a second surface is opposite to the first surface; an antenna structure, comprising a second packaging layer, a first antenna metal layer, a second rewiring layer, and a first metal bump, where the first antenna metal layer is disposed on a first surface of the second packaging layer, the second rewiring layer is disposed on a second surface of the second packaging layer, the first antenna metal layer is electrically connected to the second rewiring layer by a first metal connecting column passing through the second packaging layer, the first metal bump is formed on the second rewiring layer, and bonded to the first rewiring layer; a second metal connecting column, formed on the second surface of the first rewiring layer, where the second metal connecting column is not lower than a top surface of the antenna structure; a third packaging layer, wrapping the antenna structure, where a top surface of the second metal connecting column is exposed from the third packaging layer; a second antenna metal layer, formed on a surface of the third packaging layer, wherein the second antenna metal layer is connected to the second metal connecting column; and a second metal bump, formed in a via hole in the first packaging layer, and electrically connected to the first surface of the first rewiring layer.

Preferably, the material of the first packaging layer comprises one of polyimide (PI), silica gel, and epoxy resin, the material of the second packaging layer comprises one of PI, silica gel, and epoxy resin, and the material of the third packaging layer comprises one of PI, silica gel, and epoxy resin.

Preferably, the first rewiring layer comprises a first patterned dielectric layer and a first patterned metal wiring layer.

Preferably, the second rewiring layer comprises a stack of a second patterned dielectric layer, a second patterned metal wiring layer, and a third patterned dielectric layer.

Preferably, the material of the first patterned dielectric layer comprises one or a combination of epoxy resin, silica gel, PI, PBO, BCB, silica, phosphosilicate glass, and fluorine-containing glass, and the material of the metal wiring layer comprises one or a combination of copper, aluminum, nickel, gold, silver, and titanium.

Preferably, the material of the first metal connecting column and the second metal connecting column comprises one of Au, Ag, Cu, and Al.

Preferably, the first metal bump and the second metal bump each comprise one of a tin solder, a silver solder, and a gold-tin alloy solder.

Preferably, the footprint area of the first rewiring layer is greater than the footprint area of the antenna structure, and the second metal connecting column is distributed on the second surface of the first rewiring layer at the periphery of the antenna structure.

Preferably, the second antenna metal layer has a window in an area vertically aligned with the first antenna metal layer, to prevent the second antenna metal layer from blocking the first antenna metal layer.

The present disclosure further provides an antenna packaging method. The packaging method comprises: 1) providing a first support substrate, and forming a separation layer on the first support substrate; 2) providing an antenna circuit chip, and adhering the antenna circuit chip to the separation layer, where a front surface of the antenna circuit chip is facing the separation layer; 3) disposing a first packaging layer on the antenna circuit chip; 4) stripping off the separation layer and removing the first support substrate, to expose the front surface of the antenna circuit chip; 5) forming a first rewiring layer on the first packaging layer, wherein two ports of the antenna circuit chip are exposed, wherein the first rewiring layer comprises a first surface connected to the first packaging layer and a second surface opposite to the first surface; 6) providing an antenna structure, where the antenna structure comprises a second packaging layer, a first antenna metal layer, a second rewiring layer, and a first metal bump, where the first antenna metal layer is disposed on a first surface of the second packaging layer, the second rewiring layer is disposed on a second surface of the second packaging layer, the first antenna metal layer is electrically connected to the second rewiring layer by a first metal connecting column passing through the second packaging layer, and the first metal bump is formed on the second rewiring layer; 7) bonding the second surface of the first rewiring layer to the first metal bump; 8) forming a second metal connecting column on the second surface of the first rewiring layer, where the second metal connecting column is not lower than a top surface of the antenna structure; 9) disposing a third packaging layer over the antenna structure, performing planarization treatment on a surface of the third packaging layer, to expose a top surface of the second metal connecting column from the third packaging layer; 10) forming a second antenna metal layer on the surface of the third packaging layer, where the second antenna metal layer is connected to the second metal connecting column; and 11) forming a via hole, in the first packaging layer, for exposing the first rewiring layer, and forming a second metal bump in the via, to achieve electrical lead-out of the first rewiring layer.

Preferably, the first support substrate comprises one of a glass substrate, a metal substrate, a semiconductor substrate, a polymer substrate, and a ceramic substrate, the separation layer comprises one of an adhesive tape and a polymer layer, and the polymer layer is first coated on a surface of the first support substrate by using a spin-coating process, and then is cured by using an ultra-violet curing process or a thermal curing process.

Preferably, in the step 3), a method for depositing the antenna chip with the first packaging layer comprises one of the methods like compression molding, transfer molding, liquid seal molding, vacuum lamination, and spin-coating, and the material of the first packaging layer comprises one of PI, silica gel, and epoxy resin; and in the step 9), a method for packaging the antenna structure by using the third packaging layer comprises one of compression molding, transfer molding, liquid seal molding, vacuum lamination, and spin-coating, and the material of the third packaging layer comprises one of PI, silica gel, and epoxy resin.

Preferably, in the step 4), a method for stripping off the separation layer and removing the first support substrate comprises one of mechanical stripping and chemical stripping.

Preferably, the step 5) of manufacturing the first rewiring layer comprises steps: 5-1) forming a first dielectric layer on the surface of the first packaging layer by using a chemical vapor deposition process or a physical vapor deposition process, and patterning the first dielectric layer; and 5-2) forming a first metal layer on the first dielectric layer by using a chemical vapor deposition process, an evaporation process, a sputtering process, an electroplating process, or an electroless plating process, and etching the metal layer to pattern the metal wiring layer.

Further, the material of the dielectric layer comprises one or a combination of epoxy resin, silica gel, PI, PBO, BCB, silica, phosphosilicate glass, and fluorine-containing glass, and the material of the metal wiring layer comprises one or a combination of copper, aluminum, nickel, gold, silver, and titanium.

Preferably, the step 6) of providing the antenna structure comprises: 6-1) providing a second support substrate, and forming a stripping layer on the second support substrate; 6-2) forming a first antenna metal layer on the stripping layer, and forming a first metal connecting column on the first antenna metal layer; 6-3) depositing a second packaging layer on the first antenna metal layer and the first metal connecting column, and performing planarization treatment on the second packaging layer, to expose the first metal connecting column; 6-4) forming a second rewiring layer on the second packaging layer, and forming a first metal bump on the second rewiring layer; 6-5) separating the second support substrate from the second packaging layer, to expose the first antenna metal layer; and 6-6) performing cutting to form individual antenna structures.

Preferably, the second metal connecting column is manufactured by using a wire bonding process, where the wire bonding process comprises one of a thermal compression wire bonding process, an ultrasonic wire bonding process, and a thermal compression ultrasonic wire bonding process, and the material of the second metal connecting column comprises one of Au, Ag, Cu, and Al.

Preferably, a material of the first metal bump and the second metal bump each comprise one of a tin solder, a silver solder, and a gold-tin alloy solder.

Preferably, the width of the first rewiring layer is greater than the width of the antenna structure, and the second metal connecting column is distributed on the first rewiring layer at the periphery of the antenna structure.

Preferably, the second antenna metal layer has a window in an area vertically aligned with the first antenna metal layer, to prevent the second antenna metal layer from blocking the first antenna metal layer.

Figure 1:
FIGS. 1 to 19 show the sequential structural diagrams following each of the steps of fabricating an antenna package according to one embodiment in the present disclosure.

| Descriptions of reference numerals | |
|---|---|
| 101 | First support substrate |
| 102 | Separation layer |
| 103 | Antenna circuit chip |
| 1031 | Connecting ports |
| 104 | First packaging layer |
| 105 | First rewiring layer |
| 1051 | First dielectric layer |
| 1052 | First metal wiring layer |
| 106 | Second metal connecting column |
| 107 | Third packaging layer |

-continued

| | Descriptions of reference numerals |
|---|---|
| 108 | Second antenna metal layer |
| 109 | Second metal bump |
| 110 | Window |
| 201 | Second support substrate |
| 202 | Stripping layer |
| 203 | First antenna metal layer |
| 204 | First metal connecting column |
| 205 | Second packaging layer |
| 206 | Second rewiring layer |
| 2061 | Second dielectric layer |
| 2062 | Second metal wiring layer |
| 207 | First metal bump |

DETAILED DESCRIPTION OF THE PREFERRED EMBODIMENTS

Implementations of the present disclosure are described below by using particular and specific examples, and a person skilled in the art can easily understand other advantages and efficacy of the present disclosure from content disclosed in the specification. The present disclosure can further be implemented or applied by using other different specific implementations, details in the specification can also be based on different opinions and applications, and various modifications and changes can be made without departing the spirit of the present disclosure.

It should be noted that, figures provided in embodiments describe the basic idea of the present disclosure only in a schematic manner; only components related to the present disclosure are shown in the figures instead of drawing components based on the quantity, the shape, and the size of the components required during actual implementation; and the shape, the quantity, and the ratio of each component during actual implementation can be changed randomly, and the layout shape of the components may be more complex.

As shown in FIGS. 1 to 20, an antenna packaging method is provided. The packaging method comprises the following steps.

As shown in FIG. 1, step 1): providing a first support substrate 101, and forming a separation layer 102 on the first support substrate 101.

In an example, the first support substrate 101 may be one of a glass substrate, a metal substrate, a semiconductor substrate, a polymer substrate, and a ceramic substrate. In this embodiment, the first support substrate 101 is a glass substrate. Glass substrate is low in cost, and it is easy to form the separation layer 102 on a surface of the glass substrate, and a difficulty of a subsequent stripping process can be lowered.

In an example, the separation layer 102 may be an adhesive tape or a polymer layer. The polymer layer is first coated on a surface of the first support substrate 101 by using a spin-coating process, and then is cured by using a ultra-violet curing process or a thermocuring process.

In this embodiment, the separation layer 102 is thermocuring adhesive. After the thermocuring adhesive is formed on the first support substrate 101 by the spin-coating, the thermocuring adhesive is cured by using the thermocuring process. The thermocuring adhesive has stable performance, and a smooth surface, which facilitates manufacturing of a subsequent rewiring layer. In addition, in a subsequent stripping process, a stripping difficulty is low.

Figure 2:
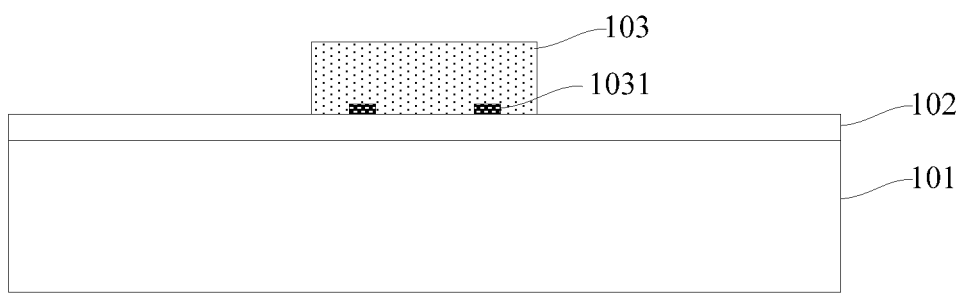

As shown in FIG. 2, step 2): providing an antenna circuit chip 103, and adhering the antenna circuit chip 103 to the separation layer 102, wherein a front surface of the antenna circuit chip 103 is toward the separation layer 102. The antenna circuit chip 103 is provided with two connecting ports 1031.

Figure 3:
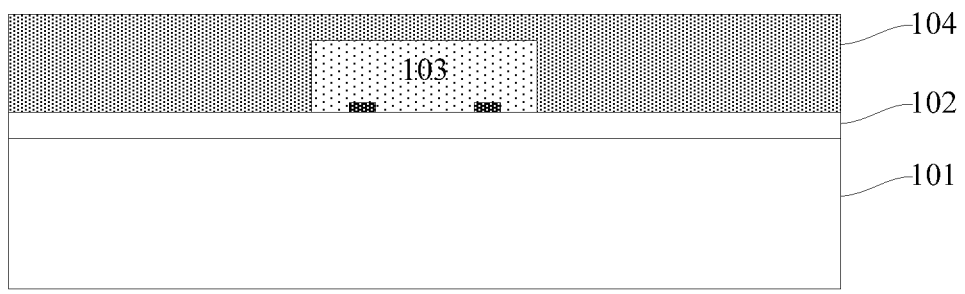

As shown in FIG. 3, step 3): depositing a first packaging layer 104 over the antenna circuit chip 103. The thickness of the first packaging layer 104 is greater than the thickness of the antenna circuit chip 103, to achieve a better protection effect.

In an example, a method for packaging the antenna chip by using the first packaging layer 104 may be one of compression molding, transfer molding, liquid seal molding, vacuum lamination, and spin-coating, and the material of the first packaging layer 104 may be one of polyimide (PI), silica gel, and epoxy resin.

Figure 4:
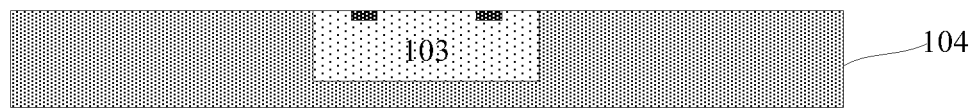

As shown in FIG. 4, step 4): stripping off the separation layer 102 and removing the first support substrate 101, to expose the front surface of the antenna circuit chip 103.

In an example, the first packaging layer 104 and the first support substrate 101 may be separated and stripped off by using a method such as mechanical stripping, laser stripping, or chemical stripping (such as wet etching) according to an property of the separation layer 102.

Figure 5A:
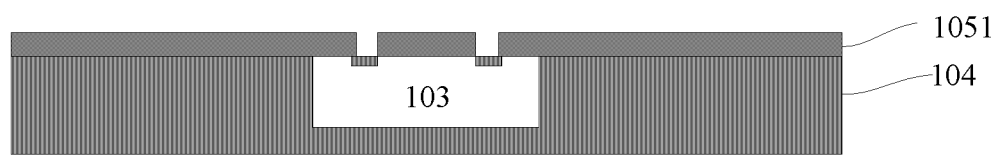
Figure 5B:
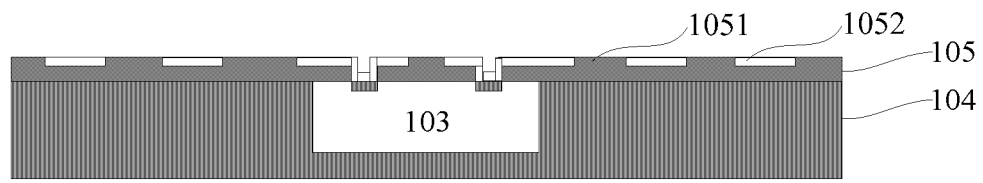

As shown in FIG. 5a and FIG. 5b, step 5): forming a first rewiring layer 105 on the front surface of the antenna circuit chip 103 and the surface of the first packaging layer 104, wherein the first rewiring layer 105 comprises a first surface connected to the first packaging layer 104 and a second surface opposite to the first surface.

The step 5) of manufacturing the first rewiring layer 105 comprises the following steps.

Step 5-1), forming a dielectric layer 1051 on the surface of the first packaging layer 104 by using a chemical vapor deposition process or a physical vapor deposition process, and patterning the dielectric layer to form openings aligning to the connecting ports of the semiconductor chip, as shown in FIG. 5a. The material of the dielectric layer may be one or a combination of epoxy resin, silica gel, PI, Polybenzoxazole (PBO), Benzocyclobutene (BCB), silica, phosphosilicate glass, and fluorine-containing glass.

Preferably, the material of the dielectric layer is PI, to further reduce a process difficulty and process costs.

Step 5-2), forming a metal wiring layer 1052 on a surface of the patterned dielectric layer by using a chemical vapor deposition process, an evaporation process, a sputtering process, an electroplating process, or an electroless plating process, and patterning the metal wiring layer, as shown in FIG. 5b. The material of the metal wiring layer may be one or a combination of copper, aluminum, nickel, gold, silver, and titanium.

As shown in FIG. 6 to FIG. 14, step 6): providing an antenna structure, wherein the antenna structure comprises a second packaging layer 205, a first antenna metal layer 203, a second rewiring layer 206, and a first metal bump 207, wherein the first antenna metal layer 203 is disposed on a first surface of the second packaging layer 205, the second rewiring layer 206 is disposed on a second surface of the second packaging layer 205, the first antenna metal layer 203 is electrically connected to the second rewiring layer 206 by a first metal connecting column 204 passing through the second packaging layer 205, and the first metal bump 207 is formed on the second rewiring layer 206.

The step 6) of providing the antenna structure comprises the following steps.

Figure 6:

As shown in FIG. 6, step 6-1): providing a second support substrate 201, and forming a stripping layer 202 on the second support substrate 201.

In an example, the second support substrate 201 may be one of a glass substrate, a metal substrate, a semiconductor substrate, a polymer substrate, and a ceramic substrate. In this embodiment, the glass substrate is selected for the second support substrate 201. The glass substrate is low in cost, and it is easy to form the stripping layer 202 on a surface of the glass substrate, and a difficulty of a subsequent stripping process can be lowered.

In an example, the stripping layer 202 may be an adhesive tape or a polymer layer. The polymer layer is first coated on a surface of the second support substrate 201 by spin-coating, and then is cured by using an ultra-violet curing process or a thermal curing process.

In this embodiment, the stripping layer 202 is thermal curing adhesive. After the thermal curing adhesive is formed on the second support substrate 201 by using the spin-coating process, the thermal curing adhesive is cured by using the thermal curing process. The thermal curing adhesive has stable performance and a smooth surface, which facilitate manufacturing of a subsequent rewiring layer. In addition, in a subsequent stripping process, a stripping difficulty is low.

Figure 7:
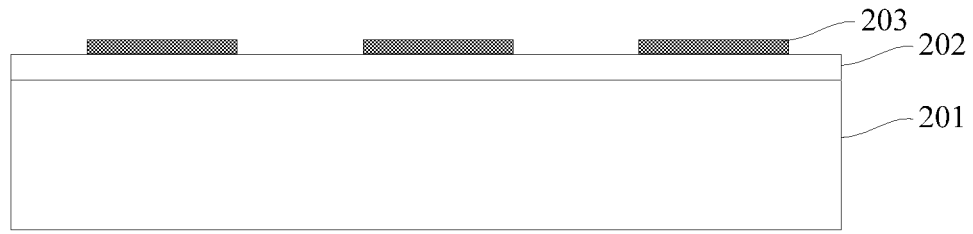
Figure 8:
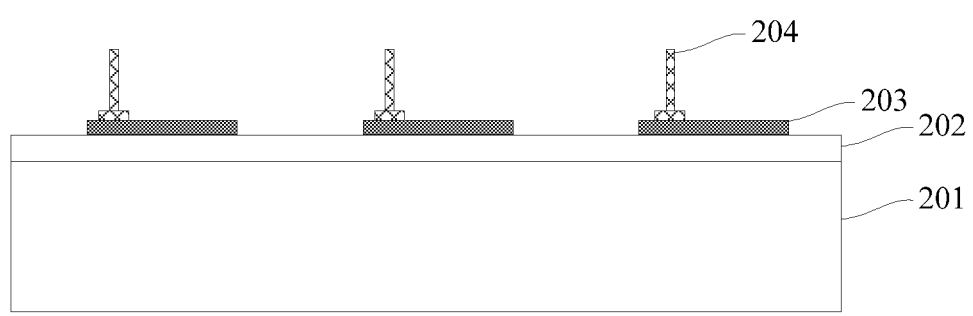

As shown in FIG. 7 and FIG. 8, step 6-2): forming a first antenna metal layer 203 on the stripping layer 202, and forming a first metal connecting column 204 on the first antenna metal layer 203.

Figure 9:
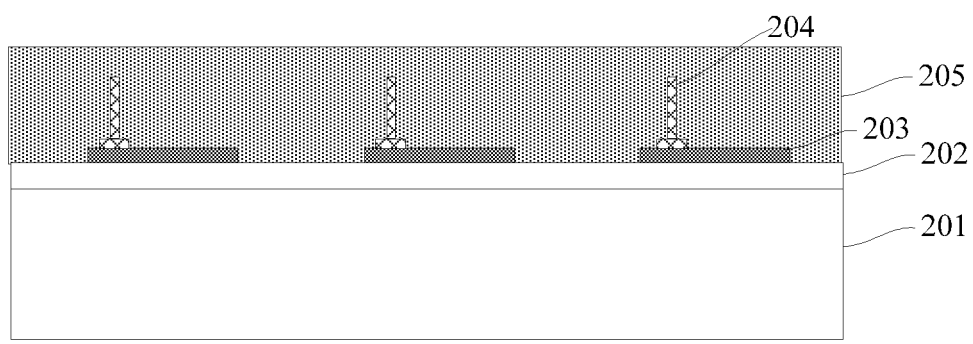
Figure 10:
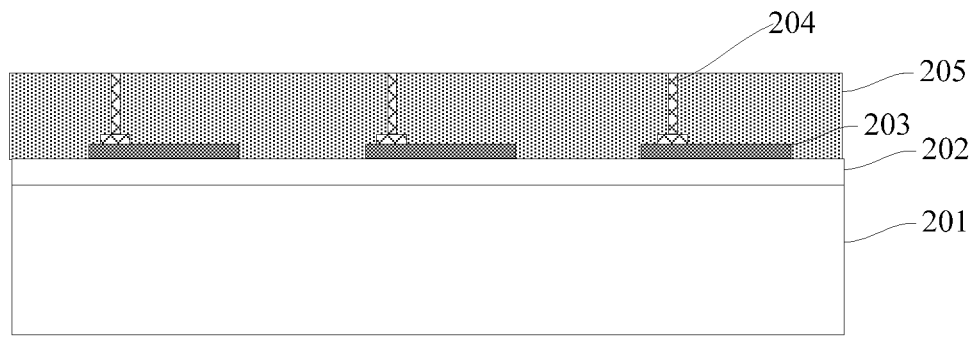

As shown in FIG. 9 and FIG. 10, step 6-3): depositing over the first antenna metal layer 203 and the first metal connecting column 204 with a second packaging layer 205, and performing planarization treatment on the second packaging layer 205, to expose the top surfaces of the first metal connecting column 204.

In an example, a method for depositing over the first antenna metal layer 203 and the first metal connecting column 204 with the second packaging layer 205 may be one of compression molding, transfer molding, liquid seal molding, vacuum lamination, and spin-coating. The material of the second packaging layer 205 may be one of PI, silica gel, and epoxy resin.

Figure 11:
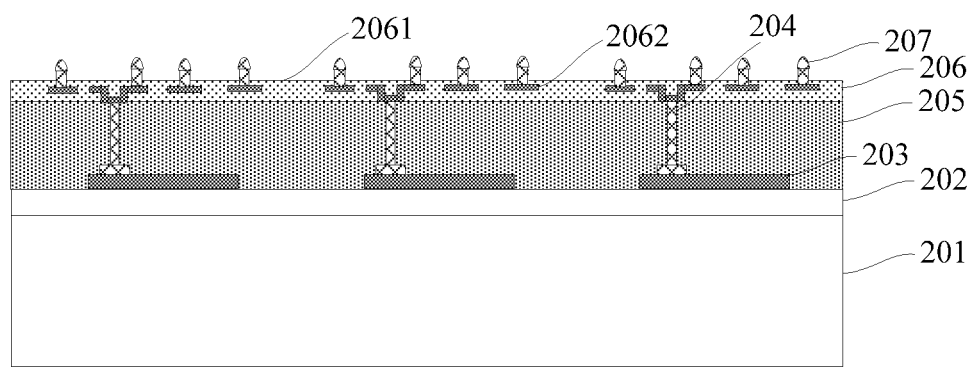

As shown in FIG. 11, step 6-4): forming a second rewiring layer 206 on the second packaging layer 205, the rewiring layer 206 includes a second dielectric layer 2061 patterned to have openings align to the top surfaces of the first metal connecting column, and a patterned second metal wiring layer 2062 on the top surface of the second rewiring layer 206, and forming a first metal bump 207 connected to the patterned conductive layer on the second rewiring layer 206. The first metal bump 207 may be one of a tin solder, a silver solder, and a gold-tin alloy solder.

Figure 12:
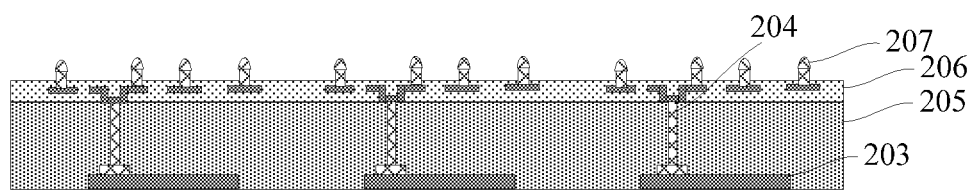

As shown in FIG. 12, step 6-5): separating the second support substrate 201 from the second packaging layer 205, to expose the first antenna metal layer 203.

Figure 13:
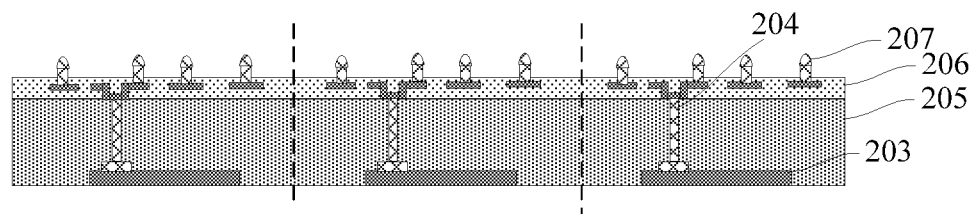
Figure 14:
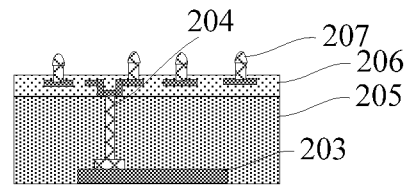

As shown in FIG. 13 and FIG. 14, step 6-6): performing die-cutting to form individual antenna structures.

Figure 15:
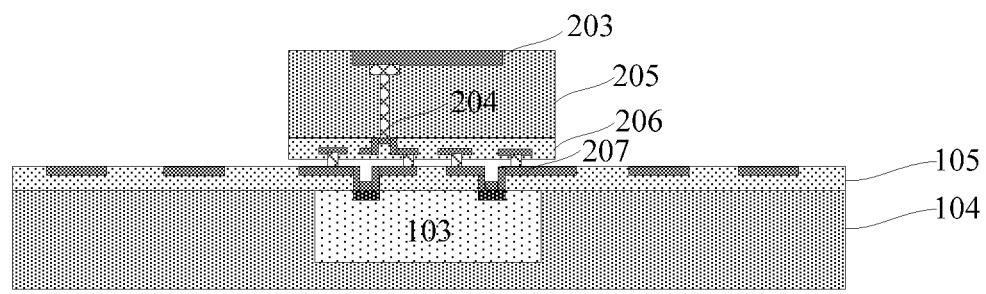

As shown in FIG. 15, step 7): bonding the second surface of the first rewiring layer 105 to the first metal bump 207, aligning the metal layer on the second surface to the first metal bumps 207. For example, the second surface of the first rewiring layer 105 may be bonded to the first metal bump 207 by welding.

Figure 16:
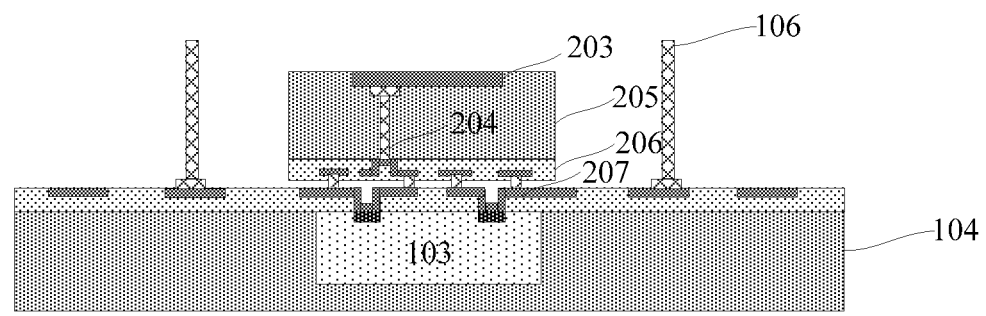

As shown in FIG. 16, step 8): forming a second metal connecting column 106 on the second surface of the first rewiring layer 105, wherein the second metal connecting column 106 is not lower than a top surface of the antenna structure.

The second metal connecting column 106 is manufactured by using a wire bonding process. The wire bonding process may be one of a thermal compression wire bonding process, an ultrasonic wire bonding process, and a thermal compression ultrasonic wire bonding process. The material of the second metal connecting column 106 may be one of Au, Ag, Cu, and Al. For example, the second metal connecting column 106 is Al, welding can be completed at a low temperature by using the ultrasonic wire bonding process, thereby greatly lowering a process temperature. In another example, the second metal connecting column 106 may be Au, so as to obtain electrical conductivity performance.

Preferably, the width of the first rewiring layer 105 is greater than the width of the antenna structure, and the second metal connecting column 106 is distributed on the first rewiring layer 105 at the periphery of the antenna structure.

Figure 17:
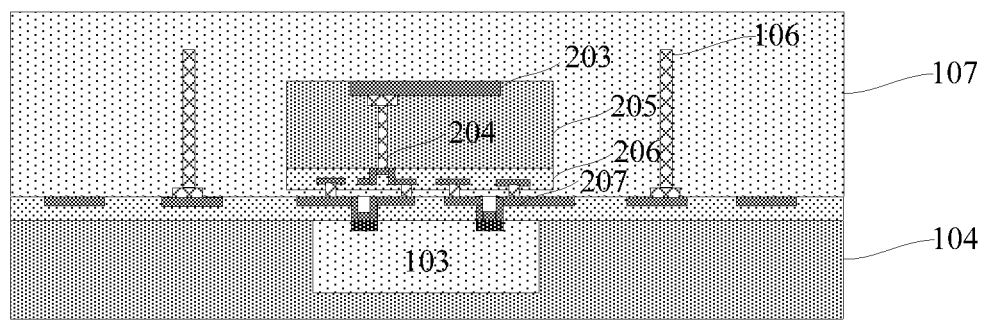
Figure 18:
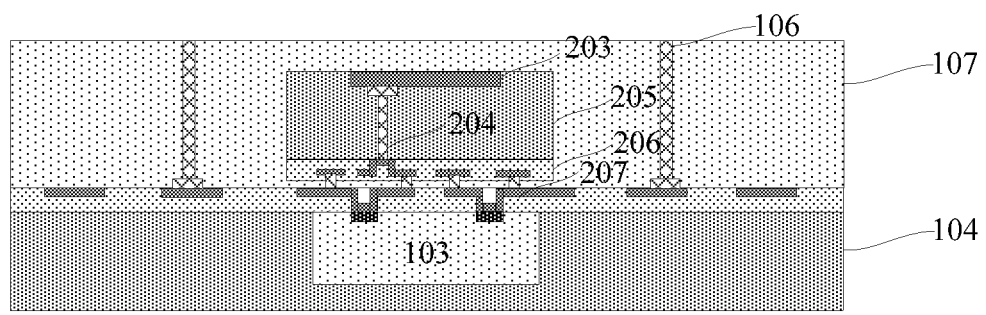

As shown in FIG. 17 and FIG. 18, step 9): depositing a third packaging layer 107 over the antenna structure, performing planarization treatment on a surface of the third packaging layer 107, to expose a top surface of the second metal connecting column 106 from the third packaging layer 107.

In an example, a method for packaging the antenna structure by using the third packaging layer 107 may be one of compression molding, transfer molding, liquid seal molding, vacuum lamination, and spin-coating. The material of the third packaging layer 107 may be one of PI, silica gel, and epoxy resin.

Figure 19:
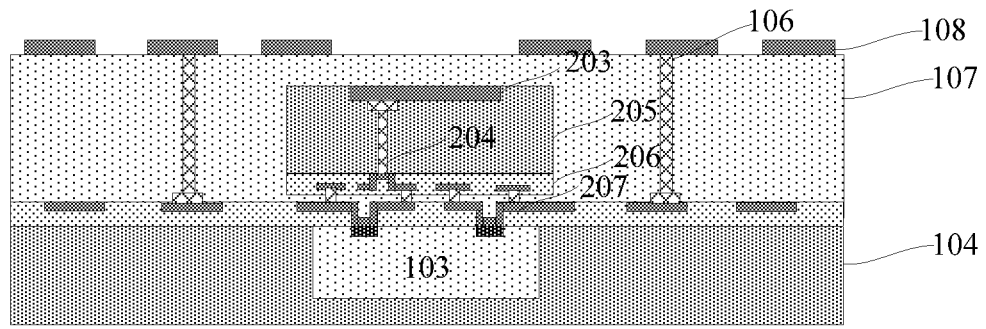

As shown in FIG. 19, step 10): forming a second antenna metal layer 108 on a surface of the third packaging layer 107, wherein the second antenna metal layer 108 is connected to the second metal connecting column 106.

In this embodiment, the second antenna metal layer 108 has a window 110 in an area vertically aligned with the first antenna metal layer 203, to prevent the second antenna metal layer 108 from blocking the first antenna metal layer 203, thereby reducing mutual interference between multiple layers of antennas, and improving performance of the multiple layers of antennas.

Figure 20:
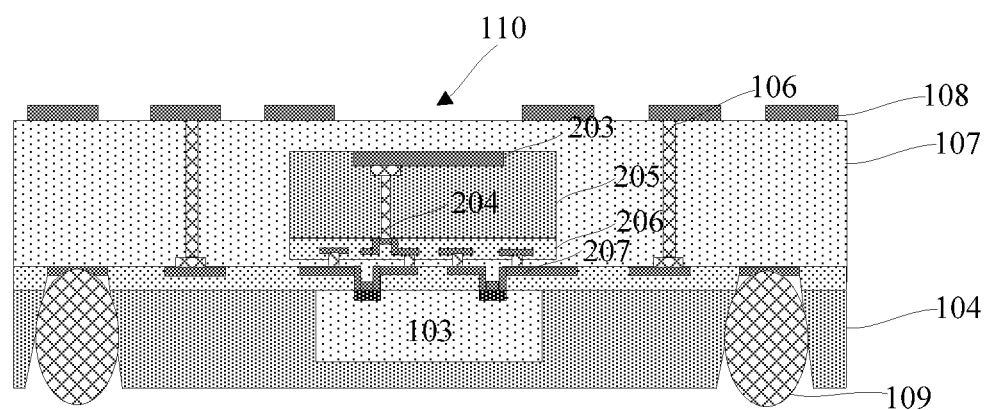
FIG. 20 shows the structural diagram of the completed antenna package according to the embodiment of the present disclosure.

As shown in FIG. 20, step 11): forming a via hole, (not labeled) in the first packaging layer 104, to expose the metal layer in the first rewiring layer 105, and forming a second metal bump 109 in the via hole, to achieve electrical lead-out of the first rewiring layer 105.

In an example, the via for exposing the first rewiring layer 105 is formed in the first packaging layer 104 by using an etching process or a laser drilling process. The second metal bump 109 is formed in the via hole by using a bumping process. The second metal bump 109 may be one of a tin solder, a silver solder, and a gold-tin alloy solder.

As shown in FIG. 20, an antenna package structure is further provided, comprising: an antenna circuit chip 103, a first packaging layer 104, a first rewiring layer 105, an antenna structure, a second metal connecting column 106, a third packaging layer 107, a second antenna metal layer 108, and a second metal bump 109.

As shown in FIG. 20, the first packaging layer 104 wraps the antenna chip, and comprises a first surface and a second surface opposite to the first surface, wherein a front surface of the antenna chip is exposed from the first surface. The material of the first packaging layer 104 may be one of PI, silica gel, and epoxy resin.

As shown in FIG. 20, the first rewiring layer 105 is formed on the front surface of the antenna circuit chip 103 and the first surface of the first packaging layer 104. The first rewiring layer 105 comprises a first surface connected to the first packaging layer 104, and a second surface opposite to the first surface.

In an example, the first rewiring layer 105 comprises a patterned dielectric layer and a patterned metal wiring layer. The material of the dielectric layer may be one or a combination of epoxy resin, silica gel, PI, PBO, BCB, silica, phosphosilicate glass, and fluorine-containing glass, and the material of the metal wiring layer may be one or a combination of copper, aluminum, nickel, gold, silver, and titanium.

As shown in FIG. 20, the antenna structure comprises a second packaging layer 205, a first antenna metal layer 203, a second rewiring layer 206, and a first metal bump 207. The first antenna metal layer 203 is disposed on a first surface of the second packaging layer 205, the second rewiring layer 206 is disposed on a second surface of the second packaging layer 205, the first antenna metal layer 203 is electrically connected to the second rewiring layer 206 by a first metal connecting column 204 passing through the second packaging layer 205, the first metal bump 207 is formed on the second rewiring layer 206, and the first metal bump 207 is bonded to the first rewiring layer 105.

In an example, the second rewiring layer 206 comprises a first patterned dielectric layer, a patterned metal wiring layer, and a second patterned dielectric layer which are sequentially stacked. The material of the dielectric layer may be one or a combination of epoxy resin, silica gel, PI, PBO, BCB, silica, phosphosilicate glass, and fluorine-containing glass. The material of the metal wiring layer may be one or a combination of copper, aluminum, nickel, gold, silver, and titanium.

In an example, the material of the first metal connecting column 204 may be one of Au, Ag, Cu, and Al.

In an example, the first metal bump 207 may be one of a tin solder, a silver solder, and a gold-tin alloy solder.

In an example, the width of the first rewiring layer 105 is greater than the width of the antenna structure, and the second metal connecting column 106 is distributed on the second surface of the first rewiring layer 105 at the periphery of the antenna structure.

In an example, the material of the second packaging layer 205 may be one of PI, silica gel, and epoxy resin.

As shown in FIG. 20, the second metal connecting column 106 is formed on the second surface of the first rewiring layer 105, and the second metal connecting column 106 is not lower than a top surface of the antenna structure.

As shown in FIG. 20, the third packaging layer 107 wraps the antenna structure, and a top surface of the second metal connecting column 106 is exposed from the third packaging layer 107.

The material of the third packaging layer 107 may be one of PI, silica gel, and epoxy resin.

As shown in FIG. 20, the second antenna metal layer 108 is formed on a surface of the third packaging layer 107, and the second antenna metal layer 108 is connected to the second metal connecting column 106.

In an example, the second antenna metal layer 108 has a window 110 in an area vertically aligned with the first antenna metal layer 203, to prevent the second antenna metal layer 108 from blocking the first antenna metal layer 203, thereby reducing mutual interference between multiple layers of antennas, and improving performance of the multiple layers of antennas.

The second metal bump 109 is formed in a via in the first packaging layer 104, and is electrically connected to the first surface of the first rewiring layer 105. In an example, the second metal bump 109 may be one of a tin solder, a silver solder, and a gold-tin alloy solder.

As described above, the present disclosure has the following beneficial effects:

By using interconnecting multiple rewiring layers, multiple antenna metal layers are integrated, multiple antenna package structures can be directly interconnected vertically, thereby greatly improving antenna efficiency and performance, and achieving high integration.

By packaging antenna structure with a fan-out packaging method, a packaging volume is effectively reduced, so that the antenna package structure achieves high integration and better packaging performance, and has a wide application prospect in the semiconductor packaging field.

Therefore, the present disclosure effectively overcomes various disadvantages in the prior art and has high industrial utilization value.

The foregoing embodiments are merely intended to exemplarily describe the principles and efficacy of the present disclosure and are not intended to limit the present disclosure. A person skilled in the art can make modifications or changes to the foregoing embodiments without departing from the spirit and scope of the present disclosure. Therefore, any equivalent modifications or changes completed by a person of common knowledge in the art without departing from the spirit and technical thoughts disclosed in the present disclosure shall still fall within the scope of the claims of the present disclosure.

The invention claimed is:

1. An antenna package structure, comprising:
    an antenna circuit chip;
    a first packaging layer, disposed on the antenna chip, wherein the first packaging layer comprises a first surface and a second surface opposite to the first surface, wherein two ports on a front surface of the antenna chip are exposed from the first surface;
    a first rewiring layer, formed on the first surface of the first packaging layer, wherein the first rewiring layer comprises a first surface connected to the two ports of the antenna chip, wherein a second surface is opposite to the first surface;
    an antenna structure, comprising a second packaging layer, a first antenna metal layer, a second rewiring layer, and a first metal bump, wherein the first antenna metal layer is disposed on a first surface of the second packaging layer, wherein the second rewiring layer is disposed on a second surface of the second packaging layer, wherein the first antenna metal layer is electrically connected to the second rewiring layer by a first metal connecting column passing through the second packaging layer, the first metal bump is formed on the second rewiring layer, and bonded to the first metal wiring layer of the first rewiring layer;
    a second metal connecting column, formed on the second surface of the first rewiring layer, wherein the second metal connecting column is taller than a top surface of the antenna structure;
    a third packaging layer, disposed on the antenna structure, wherein a top surface of the second metal connecting column is exposed from the third packaging layer;
    a second antenna metal layer, formed on a top surface of the third packaging layer, wherein the second antenna metal layer is patterned to connect to the second metal connecting column; and
    a second metal bump, formed in a via hole in the first packaging layer, and electrically connected to the first surface of the first rewiring layer.

2. The antenna package structure according to claim 1, wherein a material of the first packaging layer comprises one of polyimide (PI), silica gel, and epoxy resin, a material of the second packaging layer comprises one of PI, silica gel, and epoxy resin, and a material of the third packaging layer comprises one of PI, silica gel, and epoxy resin.

3. The antenna package structure according to claim 1, wherein the first rewiring layer comprises a first patterned dielectric layer and a first patterned metal wiring layer.

4. The antenna package structure according to claim 1, wherein the second rewiring layer comprises a stack of a second patterned dielectric layer, a second patterned metal wiring layer, and a third patterned dielectric layer.

5. The antenna package structure according to claim 3, wherein a material of the first patterned dielectric layer comprises one or a combination of epoxy resin, silica gel, PI, Polybenzoxazole (PBO), Benzocyclobutene (BCB), silica, phosphosilicate glass, and fluorine-containing glass, and a material of the metal wiring layer comprises one or a combination of copper, aluminum, nickel, gold, silver, and titanium.

6. The antenna package structure according to claim 4, wherein a material of the second and the third patterned dielectric layers each comprises one or a combination of epoxy resin, silica gel, PI, Polybenzoxazole (PBO), Benzocyclobutene (BCB), silica, phosphosilicate glass, and fluorine-containing glass, and a material of the metal wiring layer comprises one or a combination of copper, aluminum, nickel, gold, silver, and titanium.

7. The antenna package structure according to claim 1, wherein each of a material of the first metal connecting column and a material of the second metal connecting column comprises one of Au, Ag, Cu, and Al.

8. The antenna package structure according to claim 1, wherein the first metal bump and the second metal bump each comprises one of a tin solder, a silver solder, and a gold-tin alloy solder.

9. The antenna package structure according to claim 1, wherein the footprint area of the first rewiring layer is greater than the footprint area of the antenna structure, and the second metal connecting column is distributed on the second surface of the first rewiring layer at the periphery of the antenna structure.

10. The antenna package structure according to claim 1, wherein the second antenna metal layer has a window in an area vertically aligned with the first antenna metal layer, to prevent the second antenna metal layer from blocking the first antenna metal layer.

\* \* \* \* \*